(12) United States Patent
Jan

(10) Patent No.: US 6,964,419 B2
(45) Date of Patent: Nov. 15, 2005

(54) CHUCK ROLLERS AND PINS FOR SUBSTRATE CLEANING AND DRYING SYSTEM

(75) Inventor: Chin-Tsan Jan, Hsin-chu (TW)

(73) Assignee: Taiwan Seminconductor Manufacturing Co., Ltd., Hsin Chu (TW)

( * ) Notice: Subject to any disclaimer, the term of this patent is extended or adjusted under 35 U.S.C. 154(b) by 167 days.

(21) Appl. No.: 10/406,711

(22) Filed: Apr. 2, 2003

(65) Prior Publication Data

US 2004/0195785 A1 Oct. 7, 2004

(51) Int. Cl.⁷ .............................. B23B 31/103
(52) U.S. Cl. ........................ 279/106; 279/35
(58) Field of Search ................ 279/35, 36, 37, 279/89, 93, 94, 106, 109; 269/296, 299; 134/147, 153

(56) References Cited

U.S. PATENT DOCUMENTS

| | | | | |
|---|---|---|---|---|
| 2,723,861 A | * | 11/1955 | Eisler | 279/106 |
| 2,991,084 A | * | 7/1961 | Garrison | 279/2.05 |
| 3,175,820 A | * | 3/1965 | Schiler | 269/296 |
| 3,964,957 A | * | 6/1976 | Walsh | 156/345.23 |
| 5,421,056 A | * | 6/1995 | Tateyama et al. | 15/302 |
| 5,431,421 A | * | 7/1995 | Thompson et al. | 134/149 |
| 6,405,739 B1 | * | 6/2002 | Liu | 134/149 |
| 6,578,853 B1 | * | 6/2003 | Treur et al. | 279/121 |

FOREIGN PATENT DOCUMENTS

| | | | | |
|---|---|---|---|---|
| EP | 74542 A2 | * | 3/1983 | B23B/31/12 |
| JP | 2000114332 A | * | 4/2000 | H01L/21/66 |
| JP | 2001156030 A | * | 6/2001 | H01L/21/304 |
| JP | 2002254317 A | * | 9/2002 | B24D/3/00 |

* cited by examiner

*Primary Examiner*—Derris H. Banks
*Assistant Examiner*—Michael W. Talbot
(74) *Attorney, Agent, or Firm*—Tung & Associates

(57) ABSTRACT

A design for chuck rollers and a design for chuck pins for a wafer cleaning and drying system is disclosed. Each of the chuck rollers includes a roller head which ensures proper engagement of a wafer with the chuck rollers for rotation of the wafer during a wafer scrubbing process. Each of the chuck pins is provided with an extending flange or salient to prevent upward movement of and disengagement of the wafer from the chuck pins as the wafer is rotated during a wafer scrubbing and drying process. Each chuck pin may also present a wafer support surface of enhanced surface area for supporting the wafer on the chuck pin.

17 Claims, 2 Drawing Sheets

CHUCK ROLLERS AND PINS FOR SUBSTRATE CLEANING AND DRYING SYSTEM

FIELD OF THE INVENTION

The present invention generally relates to a cleaning and drying system for use in scrubbing semiconductor wafer substrates. More particularly, the present invention relates to new and improved chuck rollers and chuck pins which are characterized by enhanced accuracy and precision in the gripping and/or rotating of a substrate during cleaning and drying of the substrate, particularly after a CMP (chemical mechanical polishing) process is carried out on the substrate.

BACKGROUND OF THE INVENTION

In the fabrication of semiconductor devices from a silicon wafer, a variety of semiconductor processing equipment and tools are utilized. One of these processing tools is used for polishing thin, flat semiconductor wafers to obtain a planarized surface. A planarized surface is highly desirable on a shadow trench isolation (STI) layer, inter-layer dielectric (ILD) or on an inter-metal dielectric (IMD) layer, which are frequently used in memory devices. The planarization process is important since it enables the subsequent use of a high-resolution lithographic process to fabricate the next-level circuit. The accuracy of a high resolution lithographic process can be achieved only when the process is carried out on a substantially flat surface. The planarization process is therefore an important processing step in the fabrication of semiconductor devices.

A global planarization process can be carried out by a technique known as chemical mechanical polishing, or CMP. The process has been widely used on ILD or IMD layers in fabricating modern semiconductor devices. A CMP process is performed by using a rotating platen in combination with a pneumatically-actuated polishing head. The process is used primarily for polishing the front surface or the device surface of a semiconductor wafer for achieving planarization and for preparation of the next level processing. A wafer is frequently planarized one or more times during a fabrication process in order for the top surface of the wafer to be as flat as possible. A wafer can be polished in a CMP apparatus by being placed on a carrier and pressed face down on a polishing pad covered with a slurry of colloidal silica or aluminum.

A polishing pad used on a rotating platen is typically constructed in two layers overlying a platen, with a resilient layer as an outer layer of the pad. The layers are typically made of a polymeric material such as polyurethane and may include a filler for controlling the dimensional stability of the layers. A polishing pad is typically made several times the diameter of a wafer in a conventional rotary CMP, while the wafer is kept off-center on the pad in order to prevent polishing of a non-planar surface onto the wafer. The wafer itself is also rotated during the polishing process to prevent polishing of a tapered profile onto the wafer surface. The axis of rotation of the wafer and the axis of rotation of the pad are deliberately not collinear; however, the two axes must be parallel. It is known that uniformity in wafer polishing by a CMP process is a function of pressure, velocity and concentration of the slurry used.

A CMP process is frequently used in the planarization of an ILD or IMD layer on a semiconductor device. Such layers are typically formed of a dielectric material. A most popular dielectric material for such usage is silicon oxide. In a process for polishing a dielectric layer, the goal is to remove typography and yet maintain good uniformity across the entire wafer. The amount of the dielectric material removed is normally between about 5000 A and about 10,000 A. The uniformity requirement for ILD or IMD polishing is very stringent since non-uniform dielectric films lead to poor lithography and resulting window-etching or plug-formation difficulties. The CMP process has also been applied to polishing metals, for instance, in tungsten plug formation and in embedded structures. A metal polishing process involves a polishing chemistry that is significantly different than that required for oxide polishing.

Important components used in CMP processes include an automated rotating polishing platen and a wafer holder, which both exert a pressure on the wafer and rotate the wafer independently of the platen. The polishing or removal of surface layers is accomplished by a polishing slurry consisting mainly of colloidal silica suspended in deionized water or KOH solution. The slurry is frequently fed by an automatic slurry feeding system in order to ensure uniform wetting of the polishing pad and proper delivery and recovery of the slurry. For a high-volume wafer fabrication process, automated wafer loading/unloading and a cassette handler are also included in a CMP apparatus.

As the name implies, a CMP process executes a microscopic action of polishing by both chemical and mechanical means. While the exact mechanism for material removal of an oxide layer is not known, it is hypothesized that the surface layer of silicon oxide is removed by a series of chemical reactions which involve the formation of hydrogen bonds with the oxide surface of both the wafer and the slurry particles in a hydrogenation reaction; the formation of hydrogen bonds between the wafer and the slurry; the formation of molecular bonds between the wafer and the slurry; and finally, the breaking of the oxide bond with the wafer or the slurry surface when the slurry particle moves away from the wafer surface. It is generally recognized that the CMP process is not a mechanical abrasion process of slurry against a wafer surface.

While the CMP process provides a number of advantages over the traditional mechanical abrasion type polishing process, a serious drawback for the CMP process is the difficulty in controlling polishing rates at different locations on a wafer surface. Since the polishing rate applied to a wafer surface is generally proportional to the relative rotational velocity of the polishing pad, the polishing rate at a specific point on the wafer surface depends on the distance from the axis of rotation. In other words, the polishing rate obtained at the edge portion of the wafer that is closest to the rotational axis of the polishing pad is less than the polishing rate obtained at the opposite edge of the wafer. Even though this is compensated for by rotating the wafer surface during the polishing process such that a uniform average polishing rate can be obtained, the wafer surface, in general, is exposed to a variable polishing rate during the CMP process.

Recently, a chemical mechanical polishing method has been developed in which the polishing pad is not moved in a rotational manner but instead, in a linear manner. It is therefore named as a linear chemical mechanical polishing process, in which a polishing pad is moved in a linear manner in relation to a rotating wafer surface. The linear polishing method affords a more uniform polishing rate across a wafer surface throughout a planarization process for the removal of a film layer from the surface of a wafer. One added advantage of the linear CMP system is the simpler construction of the apparatus, and this not only reduces the cost of the apparatus but also reduces the floor space required in a clean room environment.

After they are subjected to the CMP process, wafers are typically cleaned using a wafer scrubbing and drying system, such as a Dai Nippon Screen (DNS) model AS-2000 system, for example. Such a post-CMP wafer cleaning and drying system and method includes three main stages: scrubbing of both sides of the wafer in a double-sided brush-scrubbing chamber (DBC), scrubbing of the upper surface of the wafer in a top brush scrubbing chamber (TBC), and finally, drying of the scrubbed wafer in a dry task chamber (DTC). The latter two steps may be carried out in the same chamber. These scrubbing and drying steps remove particulate contaminants as well as residual slurry from the wafer after the CMP operation.

A schematic of a typical wafer-scrubbing assembly 10 for a double-sided brush-scrubbing chamber (DBC) is shown in FIG. 1A. The assembly 10 includes a pair of roller mounts 12, each of which supports typically three rotating chuck rollers 14. As shown in FIG. 1B, each of the chuck rollers 14 typically includes a wide base 32, a narrower middle section 33 and a relatively thin top flange 34 that defines a wafer notch 35 in the top of the middle section 33. The roller mounts 12 are movable toward and away from each other. At least one of the roller mounts 12 is provided with a chuck sensor 16 fitted with a light sensor 17 that is disposed adjacent to a light source 19 which emits a light beam 18. A rotatable bottom brush holder 22 that mounts a bottom scrub brush 24 is provided between the roller mounts 12, and a top brush holder 26, to which is mounted a top scrub brush 28, is disposed above the bottom brush holder 22.

In operation, the chuck rollers 14 move toward each other to "catch" the wafer 30, with the edges of the wafer 30 inserted in the wafer notches 35 of the respective chuck rollers 14 as shown in FIG. 1B. The chuck rollers 14 rotate in the same direction to rotate the wafer 30 there between. Simultaneously, the bottom scrub brush 24 is rotated against the bottom surface of the wafer 30 and the top scrub brush 28 is rotated against the top surface of the wafer 30 to remove particulate contaminants and residual slurry adhering to these wafer surfaces.

As shown in FIG. 1B, when the wafer 30 is properly engaged by each of the multiple chuck rollers 14, the edge of the wafer 30 is inserted in the wafer notch 35, between the top flange 34 and the middle section 33 of each chuck roller 14. Accordingly, when the chuck rollers 14 are disposed in the proper wafer-engaging position, the light beam 18 emitted by the light source 19 is aligned with and received by the light sensor 17 of the chuck sensor 16, as shown in FIG. 1A. This indicates to the control system for the assembly 10 that the wafer 30 is properly engaged for scrubbing. However, as shown in FIG. 1C, one edge of the wafer 30 may be inadvertently missed by the wafer notch 35 of one or more of the chuck rollers 14, such that the wafer 30 is supported on the top surface of the relatively thin top flange 34 of the chuck roller 14. In this configuration, the light beam 18 is still aligned with and intercepted by the light sensor 17 of the chuck sensor 16, which erroneously indicates to the assembly control system that the wafer 30 is properly engaged by the chuck rollers 14 for rotation and scrubbing. Consequently, damage or breakage of the wafer 30 may result upon subsequent contact of the bottom scrub brush 24 and/or top scrub brush 28 with the wafer 30. Accordingly, chuck rollers having a new and improved configuration for ensuring proper engagement of the chuck rollers with a wafer during a wafer scrubbing operation, are needed.

A perspective view of a typical conventional wafer holder assembly 40 for a top brush scrubbing chamber (TBC) and dry task chamber (DTC) of a wafer cleaning and drying system, particularly a DNS model AS-2000 system, is shown in FIG. 2A. The wafer holder assembly 40 includes a motor housing 42 which houses a motor (not shown). A chuck base 44 having multiple elongated chuck arms 46 is rotatably engaged by the motor in the motor housing 42. A chuck pin 48 is upward-standing from the extending end portion of each chuck arm 46.

As shown in FIG. 22, each chuck pin 48 includes an attachment flange 49 for attachment of the chuck pin 48 to the corresponding chuck arm 46. A pin body 50 extends upwardly from the attachment flange 49, and a wafer support surface 51, from which extends a wafer support pin 52, is provided in the pin body 50. The pin body 50 has a diameter of typically 10 mm. A wafer catch flange 53, having a flat wafer engaging surface 54, extends upwardly beyond the wafer support surface 51.

As shown in FIG. 2C, during scrubbing of the top surface of a wafer 30 and subsequent drying of the wafer 30, the wafer 30 is supported on the wafer support pin 52 of each of the corresponding chuck pins 48, with the flat wafer engaging surface 54 on the wafer catch flange 53 of each chuck pin 48 firmly engaging the outer edge of the wafer 30. As the chuck base 44 is rotated at speeds of typically 1500–2500 rpm, the wafer 30 is likewise rotated by the chuck pins 48. One of the problems which is frequently encountered during this spinning of the wafer 30 is that the wafer 30 becomes disengaged from one or more of the chuck pins 48 by sliding upwardly against the wafer engaging surface 54, thereby causing damage or breakage to the wafer 30 as well as potential damage to the chamber in which the process is carried out. Accordingly, chuck pins having a new and improved configuration for maintaining proper engagement of the chuck pins with a wafer during wafer scrubbing and wafer drying operations, are needed.

An object of the present invention is to provide new and improved chuck rollers for rotating a wafer in a wafer cleaning and drying system.

Another object of the present invention is to provide chuck rollers each having a novel configuration which ensures proper engagement of each chuck roller with a wafer for rotation of the wafer during a wafer scrubbing process.

Still another object of the present invention is to provide chuck rollers for a wafer scrubbing and drying system, which chuck rollers each have a roller head for ensuring proper engagement of a wafer with each chuck roller and preventing wafer damage during a wafer scrubbing process.

Yet another object of the present invention is to provide new and improved chuck pins for supporting a wafer in a wafer cleaning and drying system.

A still further object of the present invention is to provide new and improved chuck pins each having a novel configuration which maintains proper engagement of the chuck pins with a wafer during wafer scrubbing and drying processes.

SUMMARY OF THE INVENTION

In accordance with these and other objects and advantages, the present invention is generally directed to a new and improved design for chuck rollers and a new and improved design for chuck pins for a wafer cleaning and drying system. Each of the chuck rollers includes a roller head which ensures proper engagement of a wafer with the chuck rollers for rotation of the wafer during a wafer scrubbing process. Each of the chuck pins is provided with an extending flange or salient to prevent upward movement of and disengagement of the wafer from the chuck pins as the wafer is rotated during a wafer scrubbing and drying process. Each chuck pin may also have an increased diameter to present a wafer support surface of enhanced surface area for supporting the wafer on the chuck pin.

BRIEF DESCRIPTION OF THE DRAWINGS

The invention will now be described, by way of example, with lo reference to the accompanying drawings, in which.

DESCRIPTION OF THE PREFERRED EMBODIMENT

The present invention includes chuck rollers which have a novel configuration for ensuring proper engagement of each of the multiple chuck rollers in a double-sided brush scrubbing chamber (DBC) of a wafer cleaning and drying system for rotation of the wafer during a scrubbing process. Each of the chuck rollers includes a thickened head or top portion which ensures proper engagement of the chuck roller with the wafer prior to commencement of the wafer scrubbing process. The present invention further includes chuck pins which have a novel configuration for preventing disengagement of each chuck pin from a wafer as the wafer is rotated during a wafer scrubbing operation and wafer drying operation in a wafer cleaning and drying system. Each chuck pin includes a salient or flange which prevents the wafer from moving upwardly on the chuck pin and becoming disengaged therefrom. Each chuck pin may also have an increased diameter to present a wafer support surface of enhanced surface area for supporting the wafer on the chuck pin.

Figure 1A:
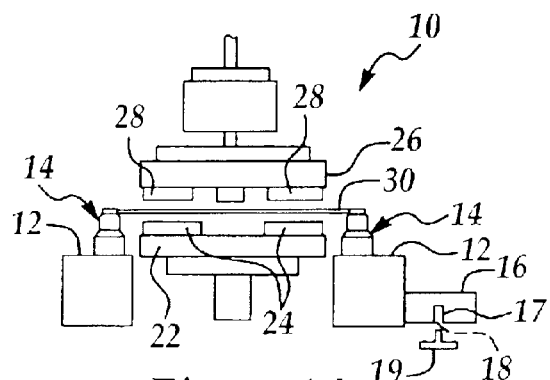
FIG. 1A is a side view of a conventional wafer-scrubbing assembly for a double-sided brush-scrubbing chamber (DBC) of a wafer cleaning and drying system.
Figure 1B:
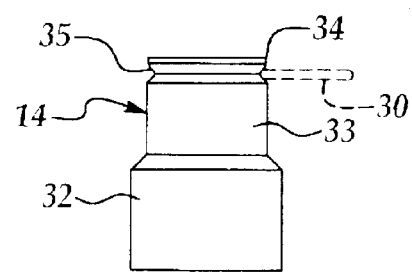
FIG. 1B is a side view of a conventional chuck roller component of the wafer scrubbing assembly of FIG. 1A.
Figure 1C:
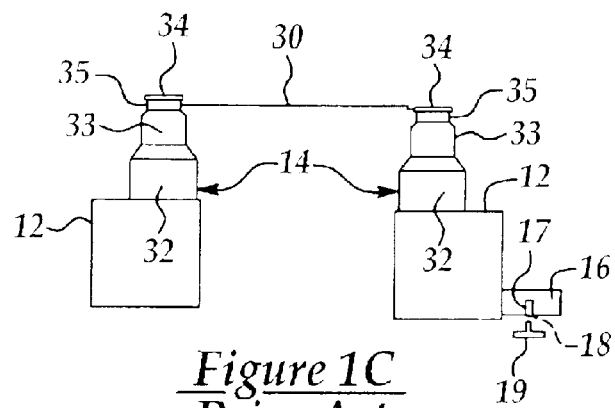
FIG. 1C is a schematic view of a conventional wafer-scrubbing assembly, illustrating misalignment of a wafer with one of the chuck rollers.
Figure 2A:
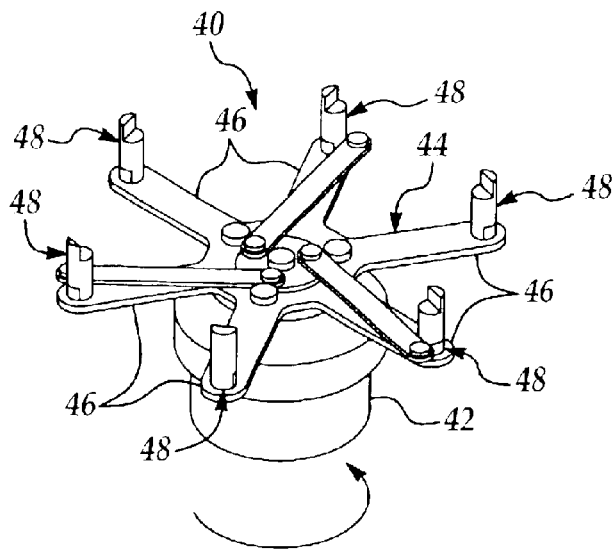
FIG. 2A is a perspective view of a conventional wafer holder assembly for a wafer cleaning and drying system.
Figure 2B:
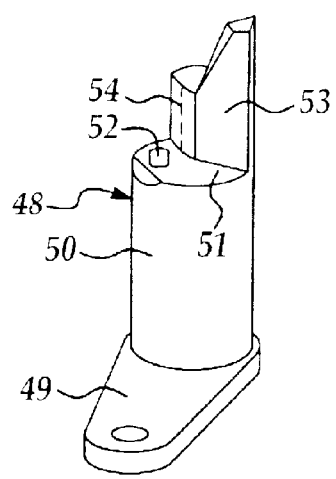
FIG. 2B is a perspective view of a conventional chuck pin element of the wafer cleaning and drying system.
Figure 2C:
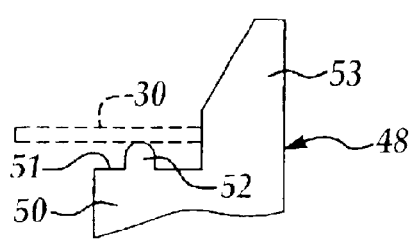
FIG. 2C is a side view, partially in section, of the conventional chuck pin of FIG. 2B, with the chuck pin supporting a wafer.
Figure 3:
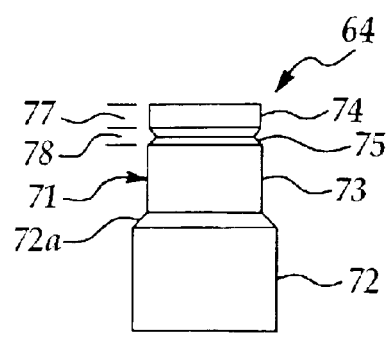
FIG. 3 is a side view of a chuck roller of the present invention.
Figure 4:
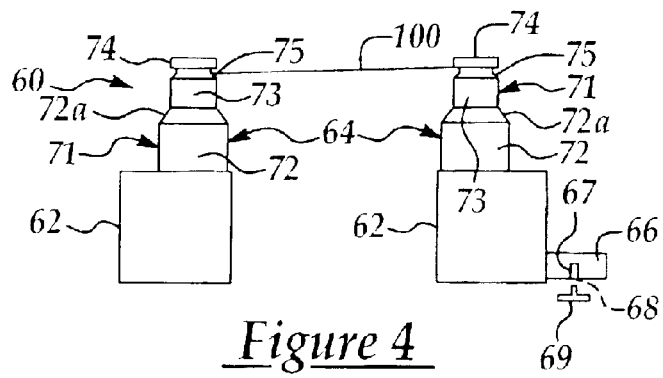
FIG. 4 is a schematic view of a wafer-scrubbing assembly for a wafer cleaning and drying system in implementation of the present invention.

Referring initially to FIGS. 3 and 4, each of multiple chuck rollers 64 of the present invention is adapted for use in a double-brush wafer scrubbing assembly 60 which may be contained in a double-sided brush scrubbing chamber (DBC) of a wafer cleaning and drying system such as a Dai Nippon Screen (DNS) model AS-2000 post-CMP wafer scrubbing and drying system, for example. In such a system, three of the chuck rollers 64 are rotatably mounted on each of two opposing roller mounts 62. The roller mounts 62 are movable toward and away from each other. Each of the roller mounts 62 is provided with a chuck alignment sensor 66 fitted with a light sensor 67 that is disposed adjacent to a light source 69 which emits a light beam 68.

As shown in FIG. 3, each of the chuck rollers 64 of the wafer scrubbing assembly 60 typically includes a cylindrical roller body 71 having a relatively wide base 72 that is rotatably mounted on the roller mount 62 and engaged by a motor (not shown) for rotation thereby. A narrower middle section 73 may extend from the base 72 at a taper 72a. However, it is understood that the body 71 may have alternative configurations. A circumferential wafer notch 75 is provided in the roller body 71 and separates the middle section 73 from a roller head 74 shaped in the top portion of the roller body 71. As shown in FIG. 3, the roller head 74 typically has a head thickness 77 which is at least as great as the notch width 78 of the wafer notch 75. A bottom scrub brush (not shown) is provided between the roller mounts 62, and a top scrub brush (not shown) is disposed above the bottom scrub brush.

In typical operation, a wafer transfer robot (not shown) positions between the chuck rollers 64 of the respective roller mounts 62 a wafer 100 to be subjected to a post-CMP scrubbing and drying process. The roller mounts 62 are actuated to move the respective opposing sets of chuck rollers 64 toward each other to "catch" or engage the wafer 100 in order to rotate the wafer 100 as both the upper and lower surfaces of the wafer 100 are scrubbed by the top and bottom scrub brushes (not shown) of the assembly 60. Accordingly, the wafer notches 75 of the respective chuck rollers 64 normally receive the edge of the wafer 100 for driving rotation of the wafer 100. In the event that the wafer notch 75 of one of the chuck rollers 64 is inadvertently misaligned with and fails to receive the edge of the wafer 100, as shown in FIG. 4, the roller head 74 of that chuck roller 64 engages the edge of the wafer 100, as illustrated. Due to the thickness of the roller head 74, the wafer 100 is incapable of sliding upwardly over the top surface of the roller head 74 as the chuck roller 64 continues to move toward the wafer 100. Consequently, the actuation system for the roller mount 62 senses the resistance imparted by the wafer 100 against the chuck roller 64 and halts further movement of the roller mount 62 and chuck roller 64. Accordingly, the light sensor 67 of the chuck alignment sensor 66 is misaligned with respect to the light beam 68 emitted by the light source 69, as shown in FIG. 4, thus signaling to the operation system (not shown) for the scrubbing assembly 60 that the wafer 100 is not properly engaged for rotation. Corrective measures may then be taken to facilitate proper engagement between all of the chuck rollers 64 and the wafer 100. After the upper and lower surfaces of the wafer 100 are scrubbed, the wafer 100 is transferred from the wafer scrubbing assembly 60 to a second chamber (not shown) in the system for both scrubbing of the upper surface of the wafer 100 and drying of the wafer 100, respectively.

Figure 5:
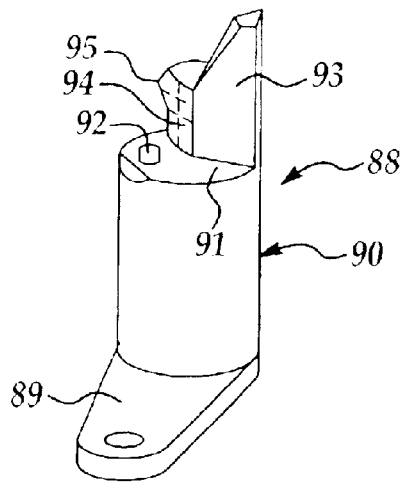
FIG. 5 is a perspective view of a chuck pin of the present invention.
Figure 6:
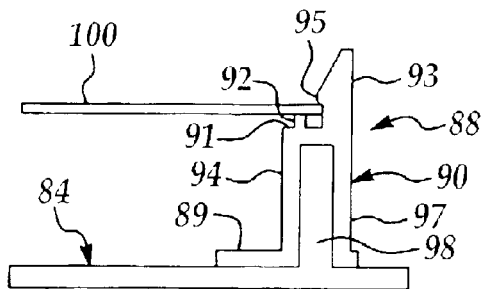
FIG. 6 is a cross-sectional view of the chuck pin of FIG. 5, with the chuck pin supporting a wafer.
Figure 7:
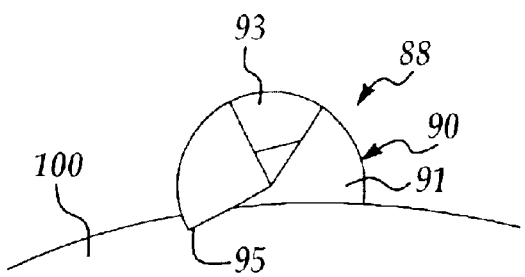
FIG. 7 is a top view of the chuck pin of the present invention, with the chuck pin supporting a wafer.

Referring next to FIGS. 5–7, each of multiple chuck pins 88 according to the present invention are included as component parts of a wafer holder assembly that is provided in the second chamber of the wafer cleaning and drying system, in which second chamber the upper surface of the wafer 100 is scrubbed and the wafer 100 is dried, respectively. Each of the chuck pins 88 is designed to support and engage the edge of the wafer 100 as the wafer holder assembly rapidly rotates the wafer 100 at speeds of typically about 1500–2500 rpm. As shown in FIG. 5, each chuck pin 88 includes a pin body 90 typically having a diameter of at least about 13 mm. The pin body 90 may include an attachment flange 89 for attachment of the pin body 90 to a corresponding one of multiple chuck arms 86 on a chuck base 84 of the wafer holder assembly. A pin mount cavity 98 that receives an upward-standing pin mount flange 97 on the chuck arm 86 may further be provided in the pin body 90. A wafer support surface 91, from which may extend a wafer support pin 92, is provided in the pin body 90. A wafer catch flange 93, having a wafer engaging surface 94, extends upwardly beyond the wafer support surface 91. A retainer salient 95 protrudes from the wafer engaging surface 94, above the wafer support surface 91.

As shown in FIGS. 6 and 7, during scrubbing of the top surface of a wafer 100 and subsequent drying of the wafer 100, the wafer 100 is supported on the wafer support pin 92 of each of the corresponding chuck pins 88. Accordingly, the flat wafer engaging surface 94 on the wafer catch flange 93 of each chuck pin 88 firmly engages the outer edge of the wafer 100, and the retainer salient 95 on the wafer catch flange 93 protrudes over the upper surface of the wafer 100. As the chuck base 84 is rotated at speeds of typically about 1500–2500 rpm, the wafer 100 is likewise rotated by the chuck pins 88. The retainer salient 95 prevents upward movement of the wafer 100 against the wafer engaging surface 94 and disengagement of the wafer 100 from the chuck pin 88. Furthermore, the increased surface area of the wafer support surface 91, provided by the increased diameter of the pin body 90, presents a greater surface area for support of the wafer 100 to prevent disengagement of the wafer 100 from the chuck pin 88. This secure engagement between each chuck pin 88 and the wafer 100 prevents damage to the wafer 100 as well as to the various components of the wafer holder assembly or other elements in the scrubbing and drying chamber.

While the preferred embodiments of the invention have been described above, it will be recognized and understood that various modifications can be made in the invention and the appended claims are intended to cover all such modifications which may fall within the spirit and scope of the invention.

What is claimed is:

1. A chuck roller for a wafer scrubbing assembly, comprising:
    a roller body;
    a wafer notch provided in said roller body; and
    a roller head provided in said roller body adjacent to said wafer notch, said roller head has a head thickness at least as great as a notch width of said wafer notch.

2. The chuck roller of claim 1 wherein said roller body comprises a base and a middle section extending from said base and wherein said wafer notch separates said middle section from said roller head.

3. The chuck roller of claim 2 wherein said roller head has a head thickness at least as great as a notch width of said wafer notch.

4. A method of preventing improper engagement of a plurality of chuck rollers on a wafer scrubbing assembly with a wafer, comprising the steps of:
    providing a wafer notch in each of said plurality of chuck rollers for receiving the wafer; and
    providing a roller head adjacent to said wafer notch, said roller head has a head thickness at least as great as a notch width of said wafer notch.

5. The method of claim 4 wherein each of said plurality of chuck rollers comprises a base and a middle section extending from said base and wherein said wafer notch separates said middle section from said roller head.

6. The method of claim 5 wherein said roller head has a head thickness at least as great as a notch width of said wafer notch.

7. A chuck pin for a wafer holder assembly, comprising:
    a pin body having a wafer support surface;
    a wafer catch flange extending from said pin body beyond said wafer support surface;
    a wafer support pin protruding from said wafer support surface; and
    a retainer salient protruding from said wafer catch flange in spaced-apart relationship to said wafer support surface.

8. The chuck pin of claim 7 wherein said pin body has a diameter of at least about 13 mm.

9. The chuck pin of claim 7 wherein said pin body has a diameter of at least about 13 mm.

10. The chuck pin of claim 7 further comprising an attachment flange carried by said pin body for attaching said pin body to the wafer holder assembly.

11. The chuck pin of claim 10 wherein said pin body has a diameter of at least about 13 mm.

12. The chuck pin of claim 10 further comprising a wafer support pin protruding from said wafer support surface.

13. The chuck pin of claim 12 wherein said pin body has a diameter of at least about 13 mm.

14. The chuck pin of claim 10 further comprising a pin mount cavity provided in said pin body for mounting said pin body on the wafer holder assembly.

15. The chuck pin of claim 14 wherein said pin body has a diameter of at least about 13 mm.

16. The chuck pin of claim 14 further comprising a wafer support pin protruding from said wafer support surface.

17. The chuck pin of claim 16 wherein said pin body has a diameter of at least about 13 mm.

* * * * *